(12) United States Patent
Kumar et al.

(10) Patent No.: US 11,521,697 B2
(45) Date of Patent: Dec. 6, 2022

(54) CIRCUIT AND METHOD FOR AT SPEED DETECTION OF A WORD LINE FAULT CONDITION IN A MEMORY CIRCUIT

(71) Applicant: STMicroelectronics International N.V., Schiphol (NL)

(72) Inventors: Shishir Kumar, Greater Noida (IN); Abhishek Pathak, Nowgong (IN)

(73) Assignee: STMicroelectronics International, N.V., Schiphol (NL)

( * ) Notice: Subject to any disclaimer, the term of this patent is extended or adjusted under 35 U.S.C. 154(b) by 278 days.

(21) Appl. No.: 16/742,292

(22) Filed: Jan. 14, 2020

(65) Prior Publication Data

US 2020/0243153 A1 Jul. 30, 2020

Related U.S. Application Data

(60) Provisional application No. 62/798,541, filed on Jan. 30, 2019.

(51) Int. Cl.
*G11C 29/38* (2006.01)
*G11C 29/44* (2006.01)
*G11C 8/10* (2006.01)

(52) U.S. Cl.
CPC .......... *G11C 29/38* (2013.01); *G11C 8/10* (2013.01); *G11C 29/44* (2013.01)

(58) Field of Classification Search
None
See application file for complete search history.

(56) References Cited

U.S. PATENT DOCUMENTS

| | | | |
|---|---|---|---|
| 5,615,163 A | 3/1997 | Sakui et al. | |
| 5,748,545 A * | 5/1998 | Lee .................. | G11C 29/02 365/189.11 |
| 5,774,471 A | 6/1998 | Jiang | |
| 5,835,419 A | 11/1998 | Ichimura et al. | |
| 6,865,133 B2 | 3/2005 | Tsukidate | |
| 6,876,557 B2 | 4/2005 | Hsu et al. | |
| 7,170,804 B2 | 1/2007 | Rehm | |
| 7,287,148 B2 | 10/2007 | Kanapathippillai et al. | |
| 7,567,464 B2 | 7/2009 | Gendrier et al. | |

(Continued)

OTHER PUBLICATIONS

Badodekar, Nilesh: "Mitigating Single-Event Upsets Using Cypress's 65-nm Asynchronous SRAM," AN88889, Cypress Doc. No. 001-88889 Rev. *C, www.cypress.com, 2014 (14 pages).

(Continued)

*Primary Examiner* — April Y Blair
*Assistant Examiner* — Matthew W Wahlin
(74) *Attorney, Agent, or Firm* — Crowe & Dunlevy (57) ABSTRACT

A row decoder located on one side of a memory array selectively drives word lines in response to a row address. A word line fault detection circuit located on an opposite side of the first memory array operates to detect an open word line fault between the opposed sides of the memory array. The word line fault detection circuit includes a first clamp circuit that operates to clamp the word lines to ground. An encoder circuit encodes signals on the word lines to generate an encoded address. The encoded address is compared to the row address by a comparator circuit which sets an error flag indicating the open word line fault has been detected if the encoded address does not match the row address.

22 Claims, 7 Drawing Sheets

(56) References Cited

U.S. PATENT DOCUMENTS

| | | | |
|---|---|---|---|
| 7,582,921 B2 | 9/2009 | Sekiguchi et al. | |
| 7,603,592 B2 | 10/2009 | Sekiguchi et al. | |
| 7,697,357 B2 | 4/2010 | Tomishima | |
| 7,904,790 B2 | 3/2011 | Lee et al. | |
| 8,189,423 B2 | 5/2012 | Keeth et al. | |
| 9,268,637 B2 | 2/2016 | Gifford et al. | |
| 9,519,442 B2 | 12/2016 | Mnich et al. | |
| 9,685,484 B1 | 6/2017 | Rabkin et al. | |
| 9,911,510 B1 | 3/2018 | Kwon et al. | |
| 9,953,994 B2 | 4/2018 | Or-Bach et al. | |
| 9,965,352 B2 | 5/2018 | Suh et al. | |
| 10,692,548 B2 | 6/2020 | Tran et al. | |
| 2003/0151437 A1* | 8/2003 | Demone | G11C 29/789 327/218 |
| 2004/0022092 A1* | 2/2004 | Dvir | G11C 29/025 365/200 |
| 2012/0008384 A1 | 1/2012 | Li et al. | |
| 2012/0281479 A1 | 11/2012 | Kochar et al. | |
| 2015/0194201 A1 | 7/2015 | Kim et al. | |
| 2015/0243368 A1* | 8/2015 | Remington | G11C 29/024 365/94 |
| 2018/0277174 A1* | 9/2018 | Tran | G11C 8/12 |
| 2020/0194093 A1 | 6/2020 | Chen et al. | |

OTHER PUBLICATIONS

Ehlig, Peter and Pezzino, Salvatore: "Error Detection in SRAM," Texas Instruments Application Report SPRACCO—Nov. 2017, 14 pages.

\* cited by examiner

CIRCUIT AND METHOD FOR AT SPEED DETECTION OF A WORD LINE FAULT CONDITION IN A MEMORY CIRCUIT

PRIORITY CLAIM

This application claims priority from United States Provisional Application for Pat. No. 62/798,541 filed Jan. 30, 2019, the disclosure of which is incorporated by reference.

TECHNICAL FIELD

The present invention generally relates to testing circuits and, in particular, to a testing circuit used to detect an open word line condition of a memory circuit.

BACKGROUND

Figure 1:
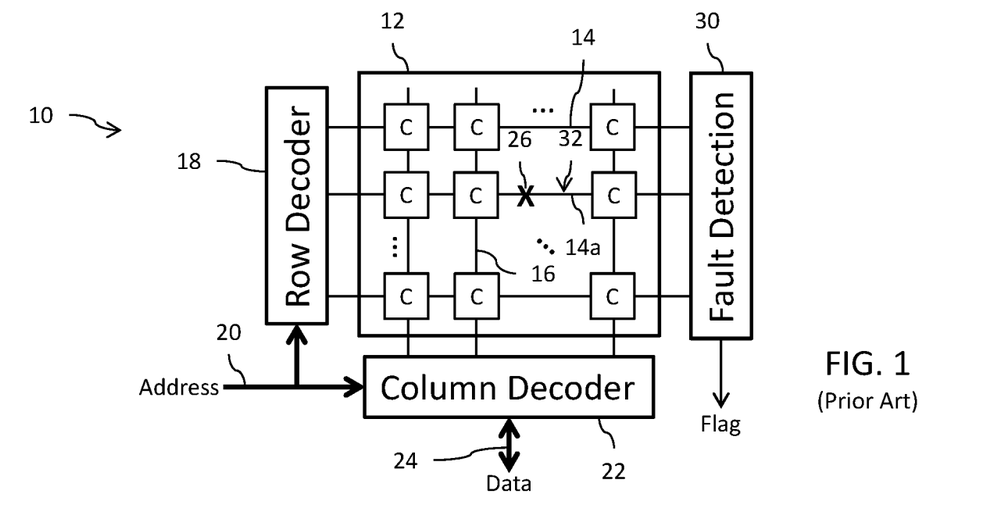
FIG. 1 is a simplified block diagram of a memory circuit.

Reference is now made to FIG. 1 which shows a simplified block diagram of a memory circuit 10. The circuit 10 includes an array 12 of memory cells C arranged in rows and columns. The memory cells in each row are controlled by a word line 14. The memory cells in each column are connected to a bit line 16. A row decoder circuit 18 receives a row address that is predecoded from an address 20 and decodes the bits of the row address to select and actuate one of the word lines 14. A column decoder circuit 22 receives a column address that is predecoded from the address 20 and decodes the bits of the column address to select a plurality of bit lines 16. In write mode, data on the data input/output lines 24 is written to the memory cells which are located at the intersections of the word line 14 and the plurality of bit lines 16 selected by the address 20. In read mode, data stored in the memory cells which are located at the intersections of the word line 14 and the plurality of bit lines 16 selected by the address 20 is read out to the data input/output lines 24.

A successful read or write operation is contingent on application of the actuation voltage (typically a logic high voltage Vdd) by the word line driver circuit at the selected word line 14 to each memory cell C in the selected row. It is recognized, however, that due to a hard fault such as, for example, a physical break in the word line 14 itself, some portion of the selected word line may be left in a floating condition. Such a hard fault 26 is illustrated in a schematic manner by the "X" mark on the faulty word line 14a. The problem with this type of hard fault is that the floating portion 32 of the faulty word line 14a can acquire any voltage from ground to Vdd as a result of charge accumulation, and this may preclude being able to detect the existence of the fault and further may lead to the writing of data to and the reading of data from incorrect memory cells.

Conventional word line fault detection circuits 30 coupled to the word lines 14 are typically configured to detect the stuck at ground fault condition and output an error Flag in response to detection of the fault. This type of fault can be due to either a hard or soft error. The conventional word line fault detection circuit 30 will be able to detect the fault where there is a physical break 26 in the word line 14 but no charge has accumulated on the floating portion 32 of the faulty word line 14a and the voltage on the floating portion 32 is at or near ground. Unfortunately, because the test for fault in that case relies on detection of the ground voltage, the conventional word line fault detection circuit 30 will not be able to detect the scenario where there is a physical break 26 in the word line 14 and sufficient charge accumulates on the floating portion 32 of the faulty word line 14a to raise the voltage on the floating portion 32 to a level well above ground.

There is a need in the art for a fault detection circuit which can ensure proper detection of a physical break in the word line.

SUMMARY

In an embodiment, a circuit comprises: a first memory array including a plurality of word lines; a row decoder located on one side of the first memory array and configured to selectively drive the plurality of word lines in response to a row address; and a first word line fault detection circuit located on an opposite side of the first memory array. The first word line fault detection circuit comprises: a first clamp circuit configured to clamp the plurality of word lines to ground; a first encoder circuit configured to encode signals on the plurality of word lines to generate a first encoded address; and a first comparator circuit configured to compare the first encoded address to the row address and set a first error flag indicating presence of an open word line fault between said one side and said opposite side of the first memory array if the first encoded address does not match the row address.

In an embodiment, a method comprises: decoding a row address to selectively drive a plurality of word lines of a first memory array at one side of the first memory array; clamping the plurality of word lines to ground at an opposite side of the first memory array; encoding signals on the plurality of word lines to generate a first encoded address; comparing the first encoded address to the row address; and setting a first error flag indicating presence of an open word line fault between said one side and said opposite side of the first memory array if the first encoded address does not match the row address.

BRIEF DESCRIPTION OF THE DRAWINGS

For a better understanding of the embodiments, reference will now be made by way of example only to the accompanying figures in which.

DETAILED DESCRIPTION

Figure 2:
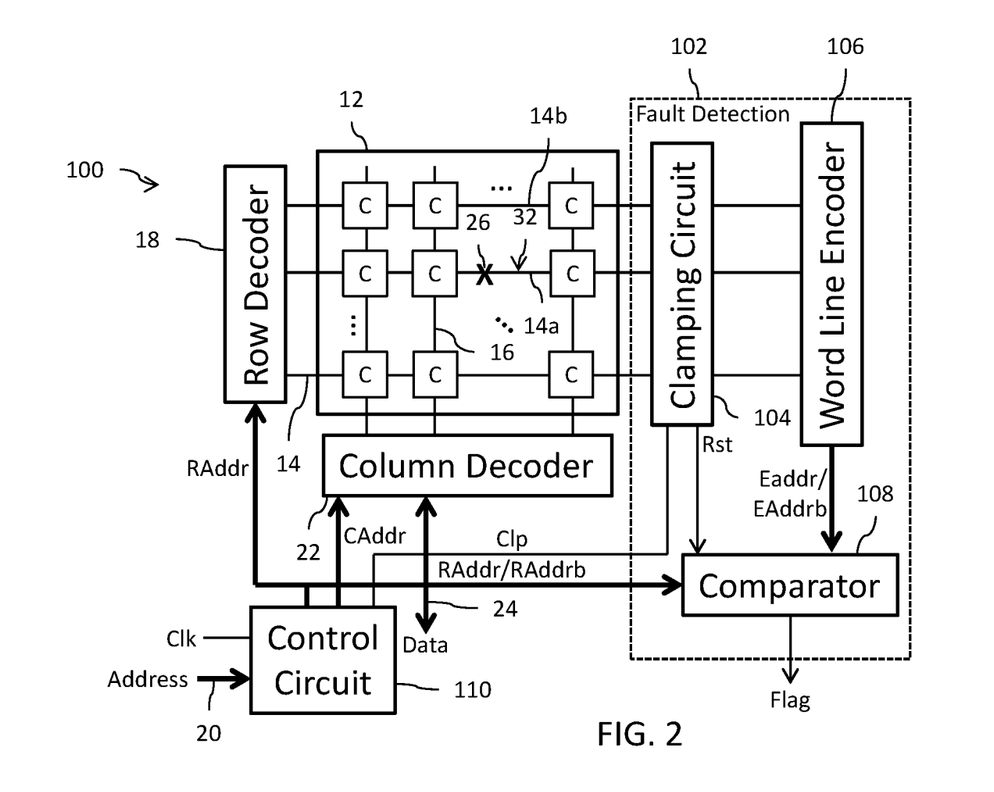
FIG. 2 is a simplified block diagram of a memory circuit with an open word line fault detection circuit.

Reference is now made to FIG. 2 which shows a simplified block diagram of a memory circuit 100 with an open word line fault detection circuit 102. The circuit 100 includes an array 12 of memory cells C arranged in rows and columns. The memory cells in each row are controlled by a word line 14. The memory cells in each column are connected to a bit line 16. A row decoder circuit 18 receives a row address RAddr and decodes the bits of the row address to select and actuate one of the word lines 14. A column decoder circuit 22 receives a column address CAddr and decodes the bits of the column address to select a plurality of bit lines 16. In write mode, data on the data input/output lines 24 is written to the memory cells which are located at the intersections of the word line 14 selected by the row decoder circuit 18 and the plurality of bit lines 16 selected by the column decoder circuit 22. In read mode, data stored in the memory cells which are located at the intersections of the word line 14 selected by the row decoder circuit 18 and the plurality of bit lines 16 selected by the column decoder circuit 22 is read out to the data input/output lines 24.

The open word line fault detection circuit 102 includes a clamping circuit 104 that responds to an assertion of a clamping signal (Clp) by clamping each of the word lines 14 to ground through an actuated damper circuit. The open word line fault detection circuit 102 further includes a word line encoder circuit 106 that is connected to each of the word lines 14 and operates to encode the signals on the word lines 14 to generate an encoded address EAddr for output. A comparator circuit 108 operates to compare the encoded address EAddr to the row address RAddr and assert an output error Flag when the addresses do not match.

In a particular implementation, the word line encoder circuit 106 operates to encode the signals on the word lines 14 to generate both the encoded address EAddr and the logical inversion of the encoded address EAddrb. The comparator circuit 108 will then operate to compare the encoded address EAddr to the row address RAddr and compare the logical inversion of the encoded address EAddrb to the logical inversion of the row address RAddrb and assert an output error Flag when either of the address comparisons fail to match.

The clamping signal (Clp) propagates to further generate a reset signal Rst that is also applied to an input of the comparator circuit 108. The comparator circuit 108 further operates to check the logic states and logic transitions of the reset signal Rst. The error Flag can also be asserted by the comparator circuit 108 in the event a problem is detected with the reset signal Rst. The reset signal Rst is generated from the clamping signal output by a control circuit 110 and functions as a tracking signal for the wordline encoder 106. Activation of the reset signal Rst indicates that sufficient voltage has been developed on the encoded address EAddr bus and the logical inversion of the encoded address EAddrb bus to permit detection of the status of the EAddr and EAddrb signals by the comparator 108. In response to the logic transition of the reset signal Rst at the comparator 108, the comparator functions to latch the EAddr and EAddrb signals and perform the comparison of the addresses.

Figure 3:
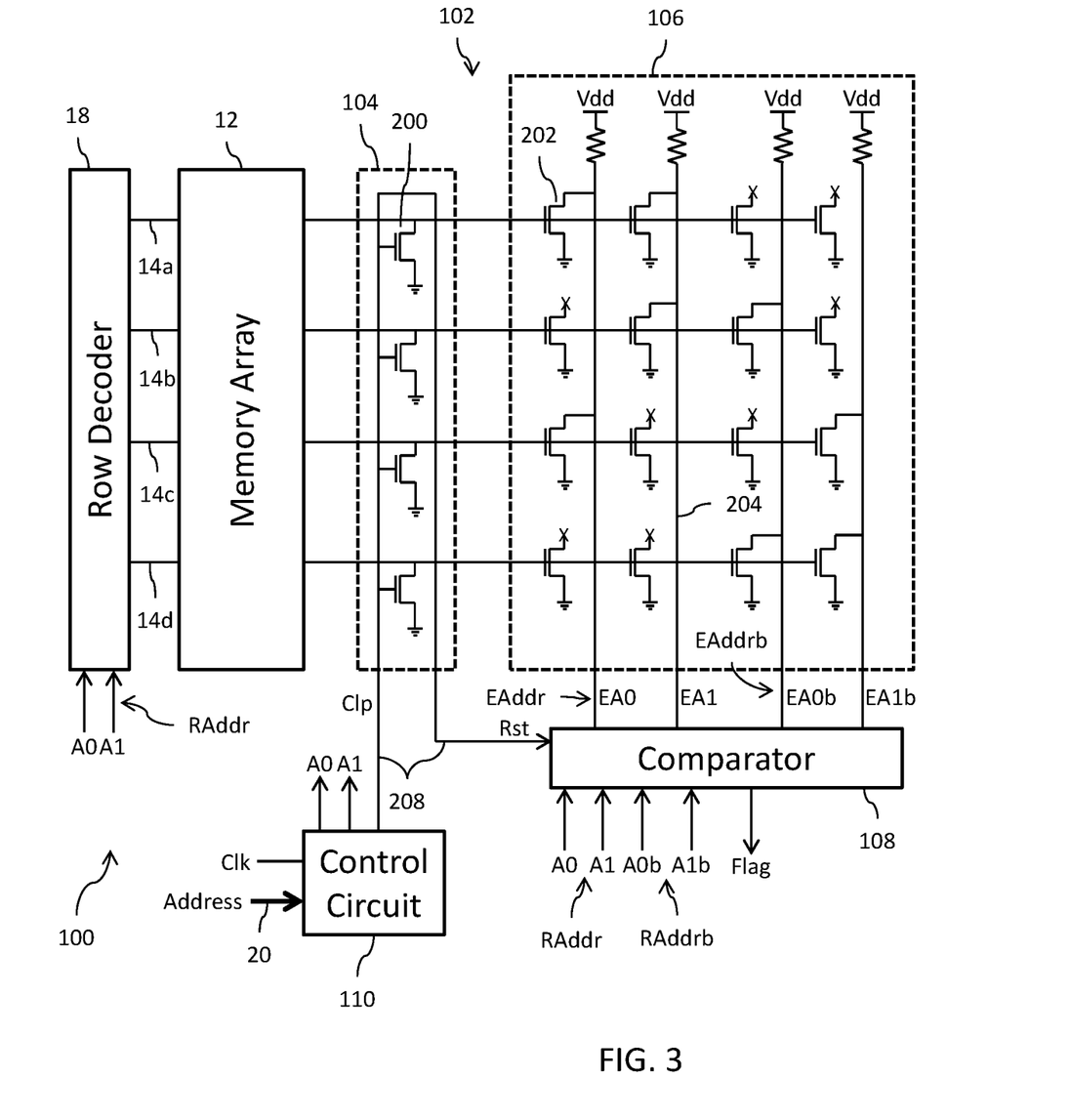
FIG. 3 is a schematic diagram of the memory circuit with the open word line fault detection circuit.

It will be noted that the signal line associated with generation of the reset signal Rst can itself suffer from a hard fault. For example, the signal line carrying the clamping signal (Clp), from which the reset signal Rst is generated, can be broken, and in such a case the clamping circuit 104 operation will be corrupted. The failure to detect the activation of the reset signal Rst at the comparator 108 is then indicative of the existence of, and the detection of, this fault. So, the status of the reset signal Rst is sensed by the comparator circuit 108, and in the event of a fault detection the flag will be set. The signal line for the reset signal Rst is connected to the control gate of the farthest damper circuit (for example, the NMOS 200 as shown in FIG. 3) of the clamping circuit 104, which thus effectively ensures that each damper circuit of the clamping circuit 104 has effectively received the clamping signal Clp.

The control circuit 110 receives an address 20 of the memory location to be accessed in read/write and performs an address predecoding operation to generate the row address RAddr that is applied to the row decoder 18 and the column address CAddr that is applied to the column decoder 22. The control circuit 110 asserts the clamping signal (Clp). The clamping circuit 104 then clamps each of the word lines 14 to ground. In response to the clock signal Clk indicating start of a memory access operation (read/write), the control circuit 110 supplies the row address RAddr and the column address CAddr and deasserts the clamping signal (Clp). The clamping circuit 104 responds by releasing the clamp on each of the word lines 14. The word line encoder circuit 106 then encodes the signals on the word lines 14 to generate the encoded address EAddr (and EAddrb). The comparator circuit 108 then functions to compare the encoded address EAddr to the row address RAddr (and compare EAddrb to RAddrb) and generate the output error Flag whose logic state is dependent on whether the compared addresses match.

The operation to control the clamping circuit 104 to clamp each of the word lines 14 to ground before the word line encoder circuit 106 operates to encode the signals on the word lines 14 and generate the encoded address EAddr is important because the clamp to ground operation effectively discharges each of the word lines 14 and in particular will effectively discharge any charge that has accumulated on the floating portion 32 of the faulty word line 14a. Thus, any accumulated charge will not be present to adversely affect the operation to encode the word line signals and generate the encoded address EAddr (and EAddrb).

Consider the following example where the memory 100 includes a faulty word line 14a which is driven by the row decoder 18 logic high and a non-faulty word line 14b driven by the row decoder logic low. Now, assume that the clamping circuit 104 is not present (or not operational) and that charge has accumulated on the floating portion 32 of the faulty word line 14a. This accumulated charge causes the voltage on the floating portion 32 of the faulty word line 14a to rise above ground. The word line encoder circuit 106 will accordingly see word line signals of logic high and logic low, respectively, on the word lines 14a and 14b which correspond to the logic high and logic low states driven by the row decoder 18 in response to the decoding of the row address RAddr. The word line encoder circuit 106 will accordingly encode the signals on the word lines 14 to generate an encoded address EAddr which matches the row address RAddr. The fault detection circuit would, in this case, fail to detect the open word line condition of the faulty word line 14a.

Now consider a modification of the foregoing example where the clamping circuit 104 is present and operational. Prior to the operation to encode the signals on the word lines 14, the clamping signal (Clp) is asserted and the clamping circuit 104 operates to clamp the word lines 14a and 14b to ground. The charge which has accumulated on the floating portion 32 of the faulty word line 14a is discharged and the voltage on the floating portion 32 is driven to ground. The word line encoder circuit 106 will accordingly see word line signals of logic low and logic low, respectively, on the word lines 14a and 14b which do not correspond to the logic high and logic low states driven by the row decoder 18 in response to the decoding of the row address RAddr. The word line encoder circuit 106 will accordingly encode the signals on the word lines 14 to generate an encoded address EAddr which does not match the row address RAddr. In this case, with the failure to match the addresses, the comparator will assert the error Flag and thus indicate a detection of the open word line condition of the faulty word line 14a.

Reference is now made to FIG. 3 which shows a schematic diagram of the memory 110 with the open word line fault detection circuit 102. It will be recognized that the schematic presents a reduced scale simplification of the FIG. 2 circuit for ease of understanding. In this reduced scale simplification, the row address RAddr has only two bits A0 and A1 and thus there are only four word lines 14a-14d. Details of the memory array 12 have also been omitted.

The open word line fault detection circuit 102 is located on an opposite side of the memory array 12 from the row decoder 18 and its word line driver circuits. Thus, the word lines 14 extend from the output of the row decoder 18 on the left side of the memory array, through and/or past each of the memory cells (C, FIGS. 1 and 2) of a corresponding row of the memory array, to the open word line fault detection circuit 102 on the right side of the memory array. This location of the open word line fault detection circuit 102 on the opposite side of the memory array from the word line drivers is important so that the open word line fault detection circuit 102 can effectively test for the open word line condition caused by a hard fault present within the memory array itself.

The clamping circuit 104 is formed by a plurality of metal oxide semiconductor field effect transistor (MOSFET) devices 200 whose gate terminals are connected to receive the clamping signal (Clp). One transistor 200 is provided per word line 14, with a first conduction terminal (for example, a drain terminal) connected to the word line 14 and a second conduction terminal (for example, a source terminal) connected to ground. The transistors 200 in the illustrated example are n-channel devices. In response to an assertion of the clamping signal (Clp), for example, asserted logic high at Vdd, each of the transistors 200 turns on to short the word lines 14 to ground. The effect of this is to clamp the word lines to ground and, in particular, to discharge any charge which has accumulated on floating portion of a faulty one of the word lines 14.

The word line encoder circuit 106 is an M×N encoder (in this example, a 4×2 encoder) which generates by true and complement encoded outputs. M is equal to the number of word lines and N is equal to the number of bits in the row address and the number of bits in the encoded address. In the embodiment shown, the word line encoder circuit 106 is implemented as a ROM-based encoder which has the advantage of fast switching operation, little to no current consumption in static conditions and low current during switching. The word line encoder circuit 106 includes a plurality of MOSFET devices 202. Plural transistors 202 are provided for each word line 14, with the gates of the plural transistors 202 connected to that word line, and wherein a first conduction terminal (for example, a drain terminal) of each transistor is either connected to an output address line 204 biased at Vdd or is left disconnected (floating) and wherein a second conduction terminal (for example, a source terminal) of each transistor is connected to ground. Each output address line 204 is connected to Vdd through an appropriate pull up device (here schematically illustrated for example only as a resistor).

With respect to the example 4×2 true encoder for producing the encoded address EAddr from the word line signals: for the pair of transistors driven by the word line 14a and connected to address lines EA0 and EA1, the first conduction terminals of the pair of transistors are connected to Vdd; for the pair of transistors driven by the word line 14b and connected to address lines EA0 and EA1, the first conduction terminal of the first transistor in the pair is disconnect and the first conduction terminal of the second transistor in the pair is connected to Vdd; for the pair of transistors driven by the word line 14c and connected to address lines EA0 and EA1, the first conduction terminal of the first transistor in the pair is connected to Vdd and the first conduction terminal of the second transistor in the pair is disconnected to Vdd; and for the pair of transistors driven by the word line 14d and connected to address lines EA0 and EA1, the first conduction terminals of the pair of transistors 202 are disconnected. This is shown only as an example, it being understood that one skilled in the art could design any suitable M×N encoder for use as the true encoder for the word line encoder circuit 106.

With respect to the example 4×2 complement encoder for producing the logically inverted encoded address EAddrb from the word line signals: for the pair of transistors driven by the word line 14a and connected to address lines EA0b and EA1b, the first conduction terminals of the pair of transistors 202 are disconnected; for the pair of transistors driven by the word line 14b and connected to address lines EA0b and EA1b, the first conduction terminal of the first transistor in the pair is connected to Vdd and the first conduction terminal of the second transistor in the pair is disconnected; for the pair of transistors driven by the word line 14c and connected to address lines EA0b and EA1b, the first conduction terminal of the first transistor in the pair is disconnected and the first conduction terminal of the second transistor in the pair is connected to Vdd; and for the pair of transistors driven by the word line 14d and connected to address lines EA0b and EA1b, the first conduction terminals of the pair of transistors 202 are connected to Vdd. This is shown only as an example, it being understood that one skilled in the art could design any suitable M×N encoder for use as the complement encoder for the word line encoder circuit 106.

There is an operational advantage to the use and evaluation of true and complement encoded addresses EAddr and EAddrb. With access to both EAddr and EAddrb signals, the comparator circuit 108 can detect three different fault cases as follows: a) open wordline, b) incorrect wordline selected, and c) multiple wordlines simultaneously selected. It will be noted that fault cases a) and b) can be detected using either EAddr and EAddrb. However, the detection of the fault case c) requires both EAddr and EAddrb.

Figure 4A:
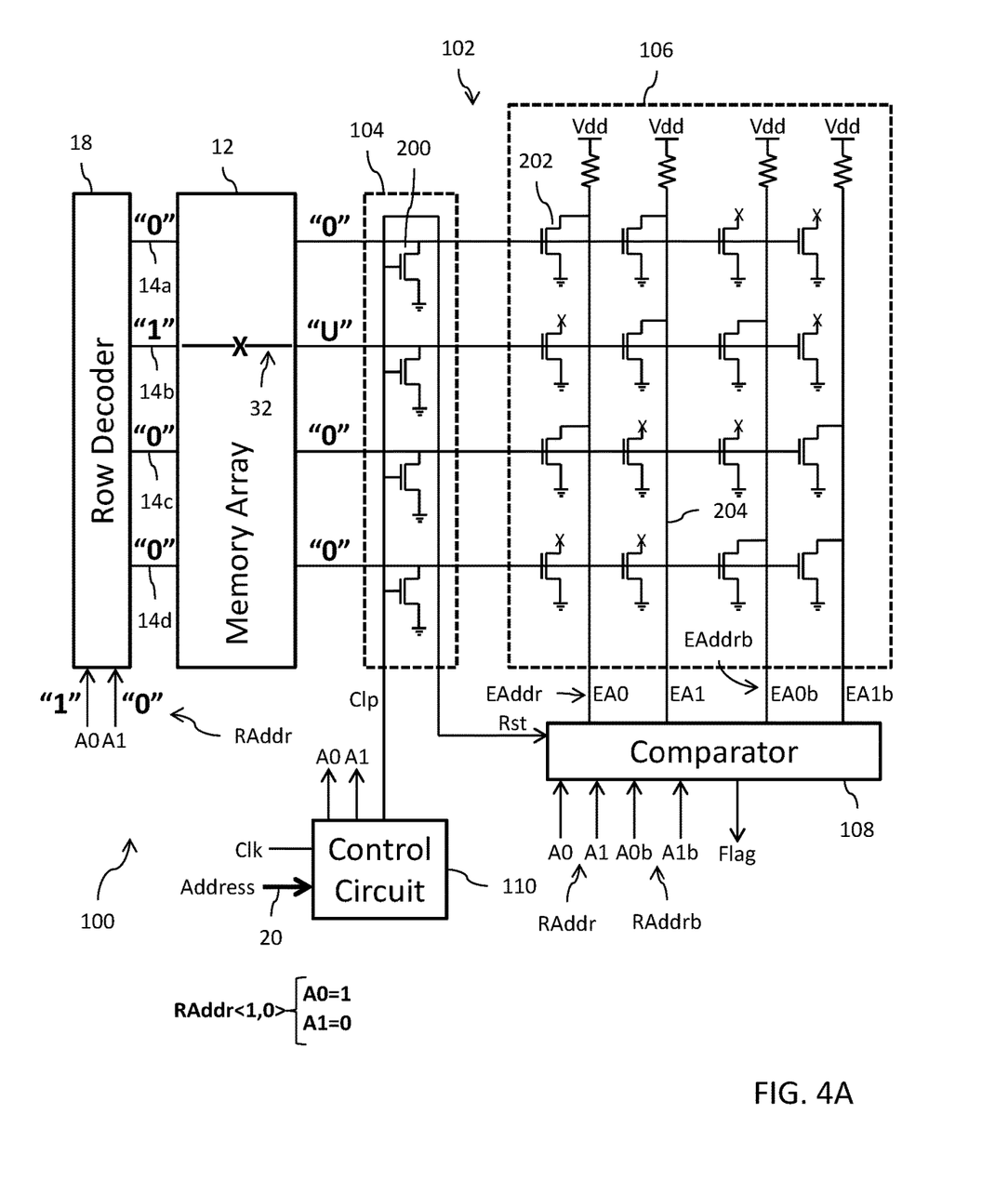
FIGS. 4A-4C illustrate operation of the circuit shown in FIG. 3 to make an open word line fault detection.
Figure 4B:
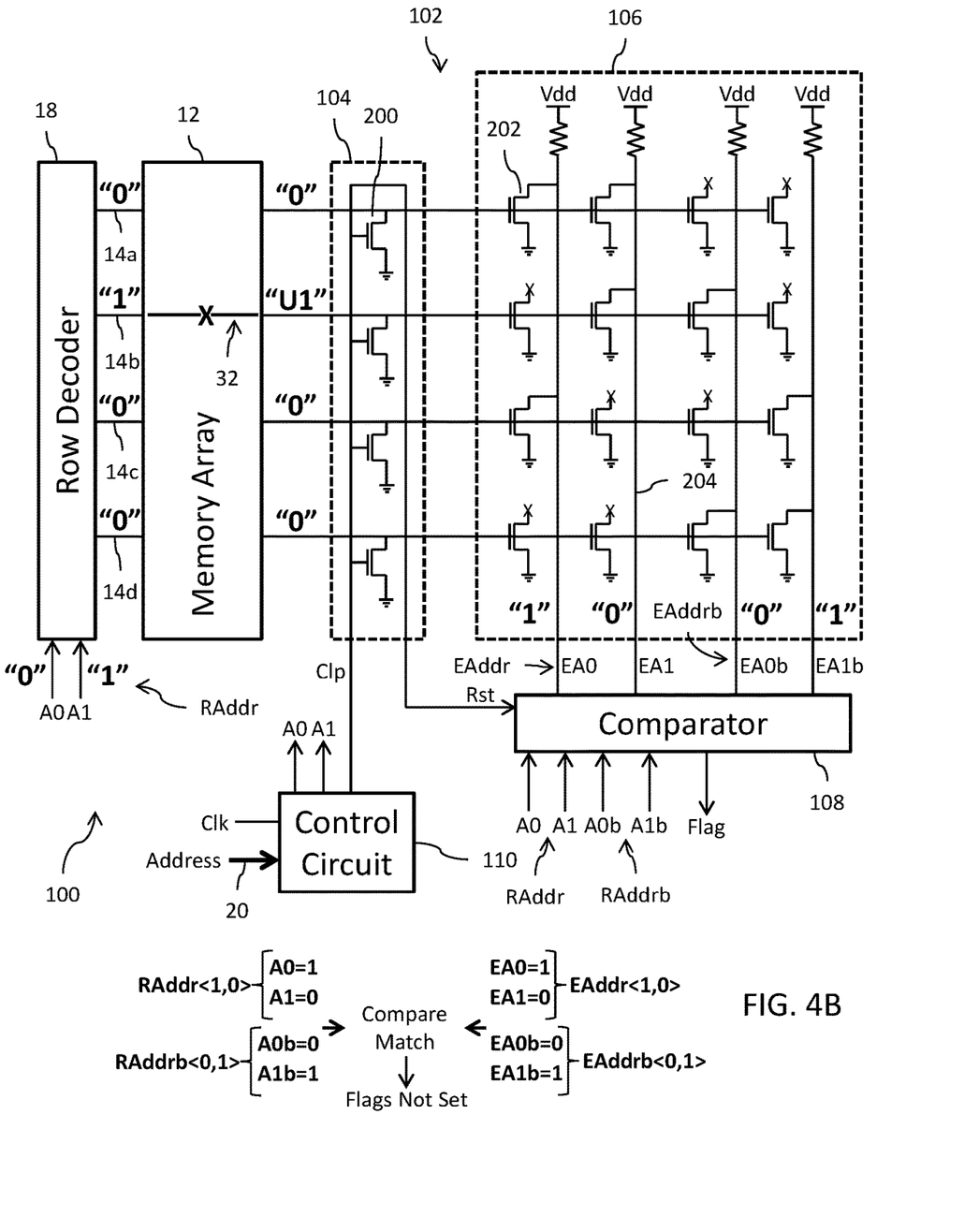
Figure 4C:
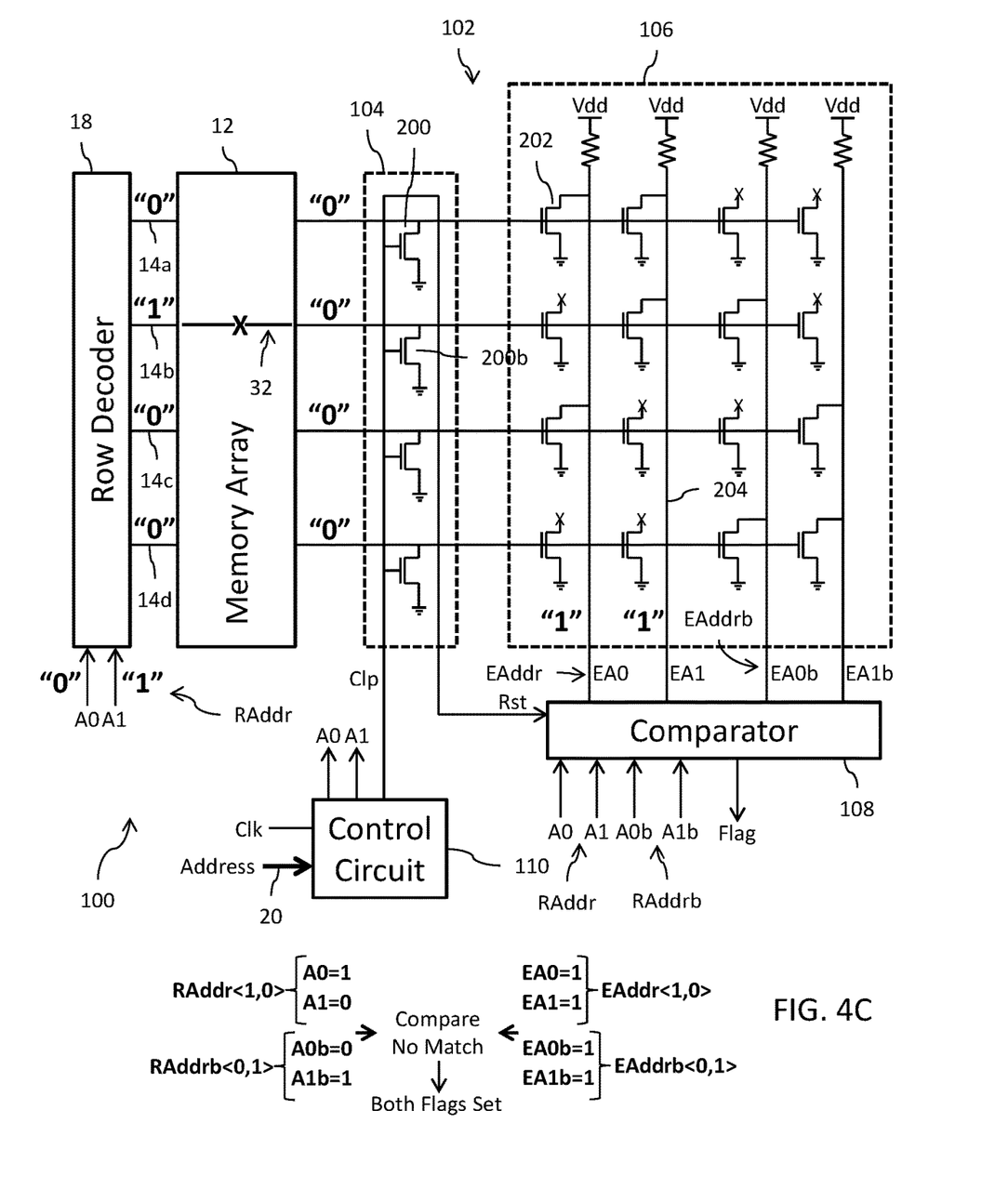

Operation of the open word line fault detection circuit 102 of FIG. 3 may be better understood through consideration of an example as illustrated in FIGS. 4A-4C. For this example, it is assumed that word line 14b has a fault within the memory array 12 in the form of a physical break in the word line 14 itself. This is generally indicated in a schematic manner by the "X" mark on the faulty wordline 14b, and this produces a floating portion 32 of the word line 14b which is connected to the open word line fault detection circuit 102.

FIG. 4A shows that the address 20 has been predecoded by the control circuit 110 to generate a row address RAddr of <1,0>. The row decoder 18 decodes this RAddr<1,0> to select word line 14b. In response to that selection, the word line driver circuits of the row decoder 18 will drive word lines 14a, 14c and 14d to ground (logic low "0") and drive word line 14b to Vdd (logic high "1"). At the opposite side of the memory array 12, the word lines 14a, 14c and 14d will also be at ground (logic low "0"). Because of the open word line fault "X" in word line 14b, however, any voltage between ground and Vdd could exist on the floating portion 32 of the word line 14b and thus the logic state of the floating portion 32 of the word line 14b is undefined (indicated by "U" in FIG. 4A).

Reference is now made to FIG. 4B. Let's now assume that there is an accumulation of charge on the floating portion 32 of the faulty word line 14b such that the logic state of the floating portion 32 of the word line 14b is no longer undefined. Indeed, a sufficient voltage may develop on floating portion 32 due to charge accumulation that the floating portion 32 is at the logic high "1" state (indicated by "U1" in FIG. 3B). Assuming that the clamping circuit 104 is not preset or is not operational, the charge accumulation will result in word line signals <0,1,0,0> which will be encoded by the word line encoder circuit 106 to generate an encoded address EAddr of <1,0> and an encoded address EAddrb of <0,1>. This occurs because none of the transistors 202 for the EA0 and EA1b address lines are turned on (thus, EA0=1 and EA1b=1) and the transistors gated by word line 14b at the "U1" state for the EA1 and EA0b address lines are turned on (thus, EA1=0 and EA0b=0). The comparator circuit 108 compares the encoded address EAddr<0,1> to the row address RAddr<0,1> and finds that the addresses DO MATCH. The comparator circuit 108 further compares the complement encoded address EAddrb<1,0> to the complement row address RAddrb<1,0> and finds that the addresses DO MATCH. In view of the address matches, the output Flag is not set. Because the Flag is not set, this indicates that the circuit 102 has not detected the fault on word line 14b. The failure to detect the fault on word line 14b in the example shown in FIG. 4B is, of course, a concern. The open word line fault detection circuit 102, however, is configured to address this failure using the clamping circuit 104.

Reference is now made to FIG. 4C. As previously noted, a sufficient accumulation of charge on the floating portion 32 of the faulty word line 14b may result in a logic high "U1" logic state for the floating portion 32 of the word line 14b (see, FIG. 4B). To address this possibility, the control circuit 110 asserts the clamping signal Clp which actuates the transistors 200 within the clamping circuit 104. All of the word lines 14a-14d are thus shorted to ground. In particular, the actuation of the transistor 200b connected to word line 14b ensures that any accumulated charge on the floating portion 32 of the faulty word line 14b is discharged and the floating portion 32 is thus driven to ground (logic low "0"). As a result, the word line signals <0,0,0,0> which will be encoded by the word line encoder circuit 106 to generate an encoded address EAddr of <1,1> and an encoded address EAddrb of <1,1>. This occurs because none of the transistors 202 for the EA0, EA1, EA0b and EA1b address lines are turned on (thus, EA0=1, EA1=1, EA0b=1 and EA1b=1). The comparator circuit 108 compares the encoded address EAddr<0,1> to the row address RAddr<1,1> and finds that the addresses DO NOT MATCH. The comparator circuit 108 further compares the complement encoded address EAddrb<1,0> to the complement row address RAddrb<1,1> and finds that the addresses DO NOT MATCH. Because there is at least one detection of non-matching addresses by the comparator circuit 108, the output Flag is set. This indicates that the circuit 102 has detected the fault on word line 14b.

The signals Clp and Rst are present on a common signal line 208. It will be noted that this common signal line 208 is routed to pass along the length of the column of the memory array 12 in one direction to make electrical contact to the gate terminals of the transistors 200 and then loop back in a return path along the length of the column of the memory array 12 in the opposite direction. This long path for the common signal line 208 introduces an RC time delay on the transition of the logic states of the signals Clp and Rst.

As noted above, the time delay is important for ensuring that sufficient voltage is developed on the EAddr and EAddrb signals before latching by the comparator circuit 108. The long path is also important so as to ensure that the signal Rst is generated from the farthest clamping NMOS 200 of the clamping circuit 104.

Figure 5:
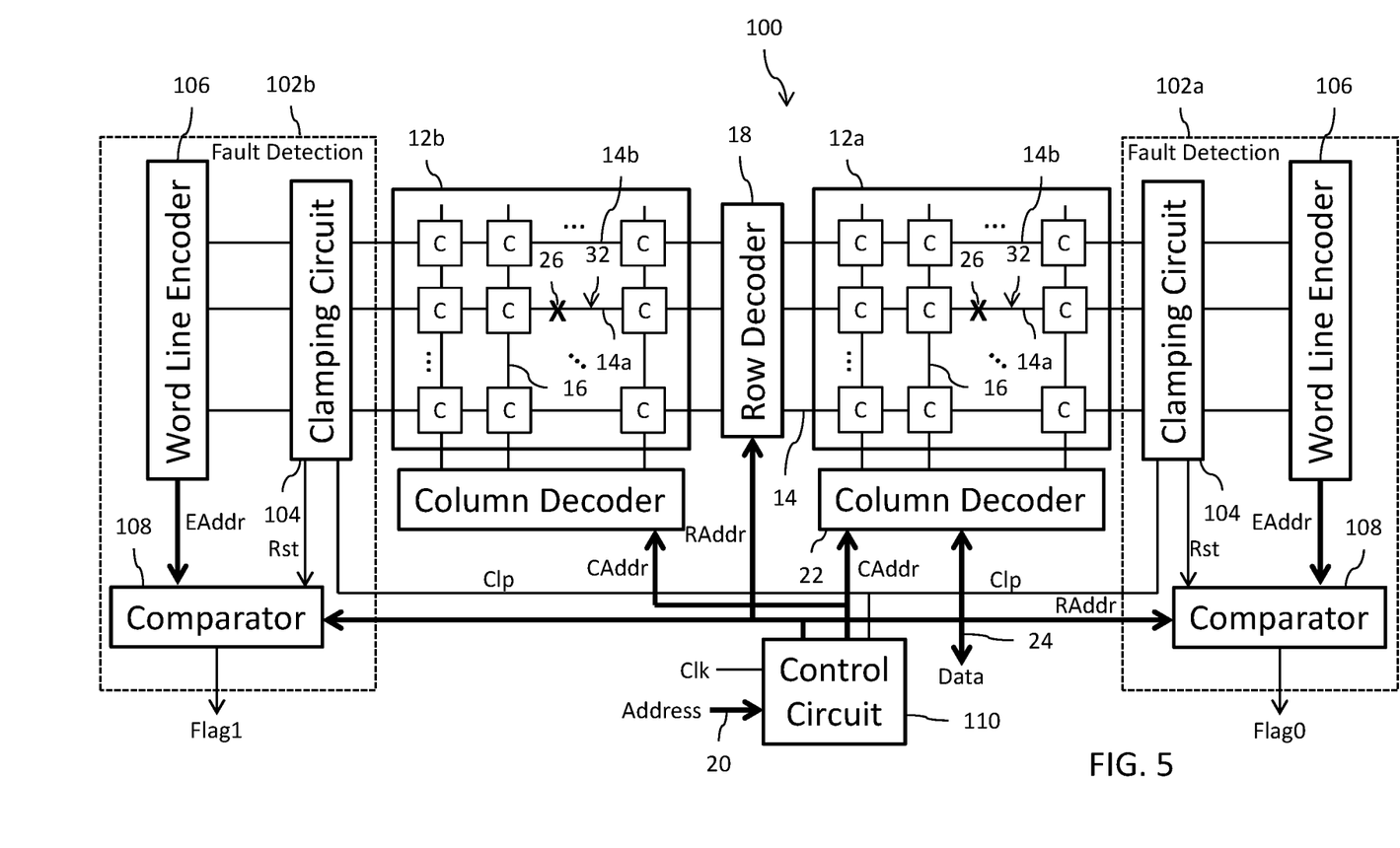
FIG. 5 is a simplified block diagram of a multi-bank memory circuit with an open word line fault detection circuit.

The implementation of FIG. 3 shows a memory circuit 100 which includes only a single memory bank formed by array 12. The open word line fault detection circuit 102 can also support fault detection operations in more complex memory architectures which include multiple memory banks. Such an implementation is shown in FIG. 5. Here, the memory circuit includes two memory banks formed by array 12a and array 12b. A row decoder 18 is used to decode the row address RAddr and select the word line 14 for both memory banks. The open word line fault detection circuit 102 may be provided with respect to each memory bank and may take the form as shown in FIG. 3. Each included circuit 102a and 102b would generate a corresponding Flag0 and Flag1, respectively.

Figure 6:
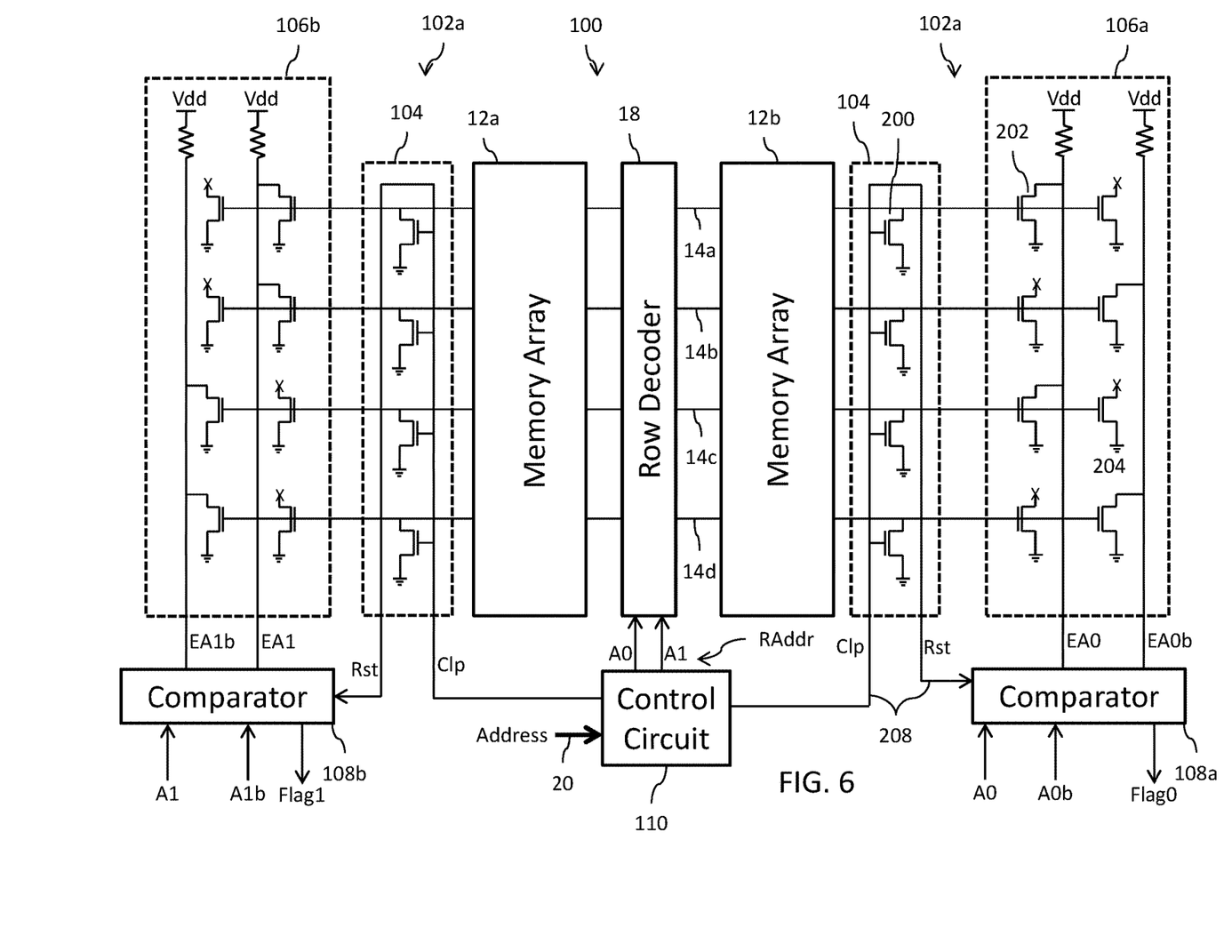
FIG. 6 is a schematic diagram of the multi-bank memory circuit with the open word line fault detection circuit.

In one implementation, the circuitry for generating the bits of the encoded address EAddr may by split between the two circuits 102a and 102b. For example, with an M×N encoder configuration, N/2 bits of the encoded address EAddr may be generated by the circuit 102a and a different N/2 bits of the encoded address EAddr may be generated by the circuit 102b. FIG. 6 shows an example of this with the 4×2 encoder configuration where the circuit 102a includes a word line encoder circuit 106a which generates the true and complement bits (EA0 and EA0b) for one portion of the encoded address (in this case, one bit; i.e., N=2/2) and the circuit 102b includes a word line encoder circuit 106b which generates the true and complement bits (EA1 and EA1b) for another portion of the encoded address (in this case, the other bit). The comparator circuit 108a compares the portion of the encoded address (with bits EA0 and EA0b) against a corresponding portion of the row address (with bits A0 and A0b) to detect a match and control the setting of the Flag0 where no match is detected. The comparator circuit 108b compares the portion of the encoded address (with bits EA1 and EA1b) against a corresponding portion of the row address (with bits A1 and A1b) to detect a match and control the setting of the Flag1 where no match is detected.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:
1. A circuit, comprising:
a first memory array including a plurality of word lines;
a row decoder located on one side of the first memory array and configured to selectively drive the plurality of word lines in response to a row address; and
a first word line fault detection circuit located on an opposite side of the first memory array, the first word line fault detection circuit comprising:
a first clamp circuit configured to clamp the plurality of word lines at the opposite side of the first memory array to ground in response to a change in logic state of a clamp control signal;

a first encoder circuit configured to encode signals on the plurality of word lines at the opposite side of the first memory array to generate a first encoded address; and a first comparator circuit configured to receive the clamp control signal and in response to said change in logic state compare the first encoded address to the row address and set a first error flag indicating presence of an open word line fault between said one side and said opposite side of the first memory array if the first encoded address does not match the row address;

wherein the clamp control signal propagates on a signal line from an output of a control circuit to the first clamp circuit and further propagates from the first clamp circuit to an input of the first comparator circuit, and wherein a propagation time for the clamp control signal on the signal line from the output of the control circuit to the input of the first comparator circuit is sufficient for the first encoder circuit to complete encoding of the signals on the plurality of word lines to generate the first encoded address for comparison by the first comparator circuit.

2. The circuit of claim 1, further comprising a control circuit configured to actuate the first clamp circuit through the change in logic state of the clamp control signal and apply the row address to the row decoder and then deactivate the first clamp circuit prior to the first encoder circuit operation to encode the signals on the plurality of word lines and generate the first encoded address.

3. The circuit of claim 2, wherein the first clamp circuit comprises a plurality of transistors connected to the plurality of word lines at the opposite side of the first memory array, the plurality of transistors having gate terminals coupled to receive the clamp control signal output from the control circuit and the plurality of transistors being configured to electrically connect the plurality of word lines to ground.

4. The circuit of claim 1, wherein the first encoder circuit is an M×N encoder, wherein M is equal to the number of word lines and N is equal to the number of bits in the row address.

5. The circuit of claim 1, wherein the first encoder circuit is further configured to encode signals on the plurality of word lines to generate a complement first encoded address and wherein the comparator circuit is further configured to compare the complement first encoded address to a complement of the row address and set the first error flag if the complement first encoded address does not match the complement row address.

6. The circuit of claim 1, wherein the clamp of the plurality of word lines to ground discharges accumulated charge on a portion of a word line which is floating due to the presence of the open word line fault between said one side and said opposite side of the first memory array.

7. The circuit of claim 1, further comprising:
a second memory array including said plurality of word lines;
wherein said row decoder is located on one side of the second memory array; and
a second word line fault detection circuit located on an opposite side of the second memory array, the second word line fault detection circuit comprising:
a second clamp circuit configured to clamp the plurality of word lines at the opposite side of the second memory array to ground;
a second encoder circuit configured to encode signals on the plurality of word lines at the opposite side of the second memory array to generate a second encoded address; and
a second comparator circuit configured to compare the second encoded address to the row address and set a second error flag indicating presence of the open word line fault if the second encoded address does not match the row address.

8. The circuit of claim 7, further comprising a control circuit configured to actuate the first and second clamp circuits through the change in logic state of the clamp control signal and apply the row address to the row decoder and then deactuate the first and second clamp circuits prior to the first and second encoder circuits operating to encode the signals on the plurality of word lines and generate the first and second encoded address.

9. The circuit of claim 8, wherein each of the first and second clamp circuits comprises a plurality of transistors connected to the plurality of word lines at the opposite side of the first memory array, the plurality of transistors having gate terminals coupled to receive the clamp control signal output from the control circuit and the plurality of transistors being configured to electrically connect the plurality of word lines to ground.

10. The circuit of claim 7, wherein each of the first and second first encoder circuits is an M×N encoder, wherein M is equal to the number of word lines and N is equal to the number of bits in the row address.

11. The circuit of claim 7, wherein each of the first and second first encoder circuits is an M×N encoder, wherein M is equal to the number of word lines and N is equal to a fraction of the number of bits in the row address.

12. The circuit of claim 11, wherein the fraction is one divided by the number of memory arrays.

13. The circuit of claim 7, wherein the first and second encoder circuits are further configured to encode signals on the plurality of word lines to generate a complement first encoded address and complement second encoded address, respectively, and wherein the first and second comparator circuits are further configured to compare the complement first and second encoded addresses to a complement of the row address, respectively, and set the first and second error flags if the addresses do not match.

14. A method, comprising:
decoding a row address to selectively drive a plurality of word lines of a first memory array at one side of the first memory array;
clamping the plurality of word lines to ground at an opposite side of the first memory array in response to a change in logic state of a clamp control signal;
encoding signals on the plurality of word lines at the opposite side of the first memory array to generate a first encoded address;
in response to said change in logic state of the clamp control signal, comparing the first encoded address to the row address;
setting a first error flag indicating presence of an open word line fault between said one side and said opposite side of the first memory array if the first encoded address does not match the row address; and
propagating said clamp control signal over a signal line to a clamp circuit performing said clamping and further to a comparison circuit performing said comparing;
wherein a propagation time for the clamp control signal along the signal line to the comparison circuit is sufficient for completing said encoding signals on the plurality of word lines to generate the first encoded address for comparison to the row address.

15. The method of claim 14, further comprising releasing the clamping of the plurality of word lines prior to encoding the signals on the plurality of word lines.

16. The method of claim 14, wherein encoding further comprises encoding signals on the plurality of word lines to generate a complement first encoded address, and wherein comparing further comprises comparing the complement first encoded address to a complement of the row address, and wherein setting further comprises setting the first error flag if the complement first encoded address does not match the complement row address.

17. The method of claim 14, wherein clamping the plurality of word lines to ground discharges accumulated charge on a portion of a word line which is floating due to the presence of the open word line fault between said one side and said opposite side of the first memory array.

18. The method of claim 14, wherein decoding further selectively drives the plurality of word lines of a second memory array at one side of the second memory array, the method further comprising:
    clamping the plurality of word lines to ground at an opposite side of the second memory array;
    encoding signals on the plurality of word lines at the opposite side of the second memory array to generate a second encoded address;
    comparing the second encoded address to the row address; and
    setting a second error flag indicating presence of an open word line fault between said one side and said opposite side of the second memory array if the second encoded address does not match the row address.

19. The method of claim 18, further comprising releasing the clamping of the plurality of word lines prior to encoding the signals on the plurality of word lines.

20. The method of claim 18, wherein encoding further comprises encoding signals on the plurality of word lines to generate a complement second encoded address, and wherein comparing further comprises comparing the complement second encoded address to a complement of the row address, and wherein setting further comprises setting the second error flag if the complement second encoded address does not match the complement row address.

21. The method of claim 14, further comprising setting said first error flag in response to a failed change in logic state of the clamp control signal.

22. The circuit of claim 1, wherein the comparator circuit is configured to set said first error flag in response to a failed change in logic state of the clamp control signal.

\* \* \* \* \*